(12) United States Patent
Okada et al.

(10) Patent No.: US 11,933,854 B2
(45) Date of Patent: Mar. 19, 2024

(54) BATTERY MANAGEMENT CIRCUIT, BATTERY MANAGEMENT SYSTEM, AND BATTERY MANAGEMENT NETWORK

(71) Applicant: Nuvoton Technology Corporation Japan, Kyoto (JP)

(72) Inventors: Yu Okada, Osaka (JP); Hitoshi Kobayashi, Osaka (JP); Keiichi Fujii, Shiga (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 17/558,366

(22) Filed: Dec. 21, 2021

(65) Prior Publication Data

US 2022/0120817 A1    Apr. 21, 2022

Related U.S. Application Data

(63) Continuation of application No. PCT/JP2020/019360, filed on May 14, 2020.

(30) Foreign Application Priority Data

Jun. 27, 2019    (JP) ................ 2019-119933

(51) Int. Cl.
*G01R 31/389*    (2019.01)
*B60L 58/10*    (2019.01)
(Continued)

(52) U.S. Cl.
CPC ............ *G01R 31/389* (2019.01); *B60L 58/10* (2019.02); *B60R 16/0315* (2013.01);
(Continued)

(58) Field of Classification Search
None
See application file for complete search history.

(56) References Cited

U.S. PATENT DOCUMENTS 10,023,064 B2    7/2018  Lee
2008/0054847 A1*  3/2008  Elias ................ H02J 7/0069
                                          320/160
(Continued)

FOREIGN PATENT DOCUMENTS

EP    2551688 A1    1/2013
EP    2979918 A1    2/2016
(Continued)

OTHER PUBLICATIONS

Extended European Search Report dated Jan. 5, 2023 for the corresponding European Patent Application No. 20831063.1.
(Continued)

*Primary Examiner* — Jas A Sanghera
(74) *Attorney, Agent, or Firm* — Rimon P.C.

(57) ABSTRACT

A battery management circuit includes: a reference signal generator that generates a first reference frequency signal and a second reference frequency signal having a phase different from a phase of the first reference frequency signal; an alternating-current superimposer that superimposes an alternating current on the secondary battery, the alternating current having a frequency component of the first reference frequency signal; a voltage measurer that measures a voltage of the secondary battery by performing sampling using a frequency; a current measurer that measures a current of the secondary battery by performing sampling using a frequency; and a converter that converts each of results of measurements by the voltage measurer and the current measurer into a complex voltage and a complex current, by multiplying the result of the measurement by the first reference frequency signal and the second reference frequency signal.

20 Claims, 10 Drawing Sheets

(51) Int. Cl.
  *B60R 16/03* (2006.01)
  *G01R 31/3842* (2019.01)
  *H02J 7/00* (2006.01)

(52) U.S. Cl.
  CPC ...... *G01R 31/3842* (2019.01); *H02J 7/00041* (2020.01); *B60L 2210/30* (2013.01)

(56) References Cited

U.S. PATENT DOCUMENTS

| | | | |
|---|---|---|---|
| 2011/0031048 A1 | 2/2011 | Ohkura | |
| 2013/0093384 A1 | 4/2013 | Nyu et al. | |
| 2018/0217209 A1* | 8/2018 | Marsili | G01K 7/16 |
| 2019/0296403 A1 | 9/2019 | Ballantine et al. | |
| 2021/0109160 A1 | 4/2021 | Matsukawa et al. | |
| 2022/0045544 A1* | 2/2022 | Kitagawa | H01M 10/48 |

FOREIGN PATENT DOCUMENTS

| | | |
|---|---|---|
| JP | 2011-38857 A | 2/2011 |
| JP | 2015-94726 A | 5/2015 |
| WO | 2020/003841 A1 | 1/2020 |

OTHER PUBLICATIONS

International Search Report issued in corresponding International Patent Application No. PCT/JP2020/019360, dated Aug. 18, 2020, with English translation.

Z. Gong et.al., "IC for online EIS in automotive batteries and hybrid architecture for high-current perturbation in low-impedance cells," 2018 IEEE Applied Power Electronics Conference and Exposition (APEC), pp. 1922-1929.

* cited by examiner

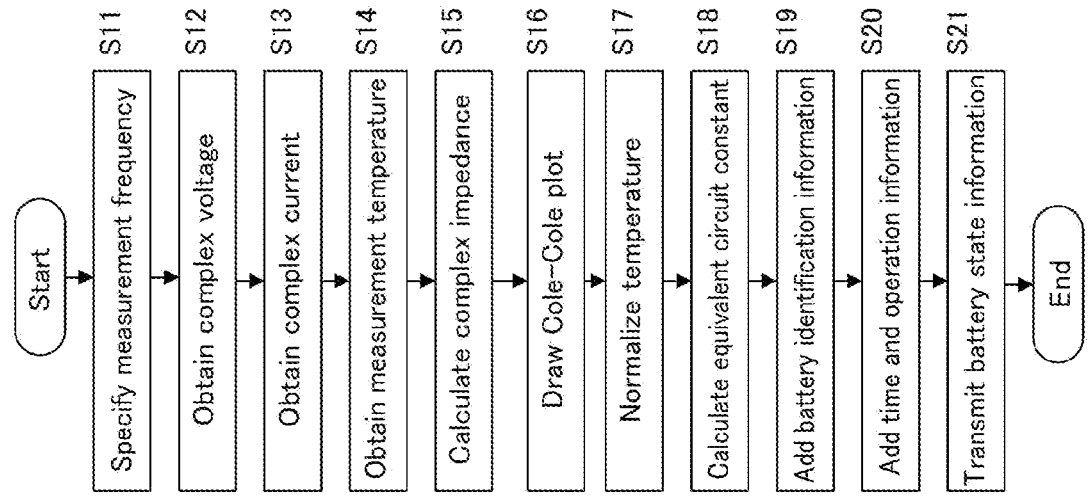

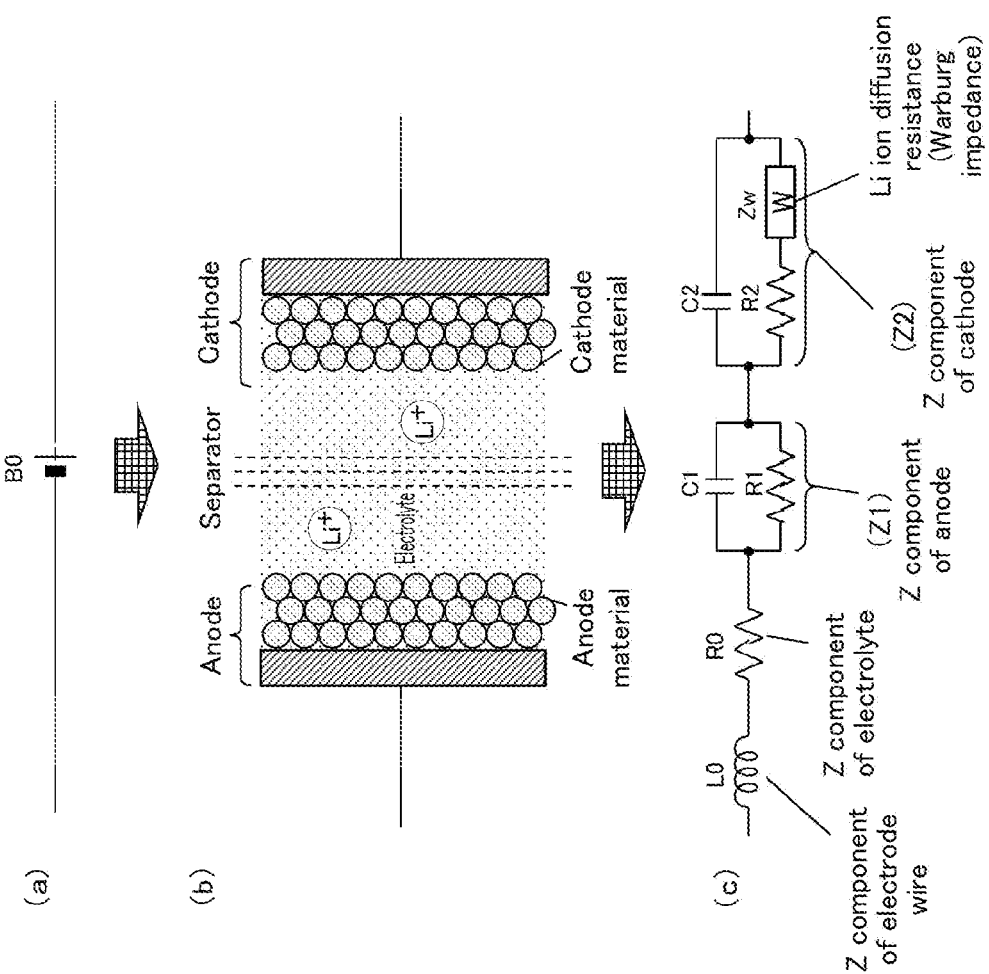

BATTERY MANAGEMENT CIRCUIT, BATTERY MANAGEMENT SYSTEM, AND BATTERY MANAGEMENT NETWORK

CROSS REFERENCE TO RELATED APPLICATIONS

This is a continuation application of PCT International Application No. PCT/JP2020/019360 filed on May 14, 2020, designating the United States of America, which is based on and claims priority of Japanese Patent Application No. 2019-119933 filed on Jun. 27, 2019. The entire disclosures of the above-identified applications, including the specifications, drawings and claims are incorporated herein by reference in theft entirety.

FIELD

The present disclosure relates to battery management circuits, battery management systems, and battery management networks that manage a battery state.

BACKGROUND

Vehicles that run on a secondary battery, such as hybrid electric vehicles (HEVs) or electric vehicles (HVs), have been under development. Moreover, known techniques estimate a remaining battery level, detect an anomaly, etc, using a battery management system (BMS) so as to use a secondary battery safely.

For example, Patent Literature (PTL) 1 discloses a battery state determination device capable of measuring a complex impedance of a battery and determining battery capacity and an amount of battery degradation.

PTL 2 discloses a capacity retention rate determination device capable of determining a capacity retention rate without fully charging and discharging a battery.

PTL 3 discloses a vehicle controller that programs charging and discharging of a battery using a parameter of a resistor-capacitor (RC) circuit model corresponding to an impedance of the battery.

Non Patent Literature (NPL) 1 specifically discloses an alternating-current superimposition method of measuring a complex impedance of a battery by applying an alternating current to measure an alternating voltage.

CITATION LIST

Patent Literature

PTL 1: Japanese Unexamined Patent Application Publication No. 2015-94726
PTL 2: Japanese Unexamined Patent Application Publication No. 2011-38857
PTL 3: U.S. Pat. No. 10,023,064

Non Patent Literature

NPL 1: "IC for online EIS in automotive batteries and hybrid architecture for high-current perturbation in low-impedance cells" Z. Gong, Z. Liu, Y. Wang et al. 2018 IEEE Applied Power Electronics Conference and Exposition (APEC)

SUMMARY

Technical Problem

Conventional techniques, however, are likely to make an error in measuring a complex impedance.

The present disclosure provides a battery management circuit, a battery management system, and a battery management network that measure a complex impedance of a secondary battery with high accuracy using a simple circuit configuration.

Solution to Problem

A battery management circuit according to one aspect of the present disclosure includes: a reference signal generator that generates a first reference frequency signal and a second reference frequency signal having a phase different from a phase of the first reference frequency signal; an alternating-current superimposer that superimposes an alternating current on the secondary battery, the alternating current having a frequency component of the first reference frequency signal; a voltage measurer that measures a voltage of the secondary battery by performing sampling using a frequency higher than a frequency of the first reference frequency signal; a current measurer that measures a current of the secondary battery by performing sampling using a frequency higher than the frequency of the first reference frequency signal; and a converter that converts each of results of measurements by the voltage measurer and the current measurer into a real part component and an imaginary part component of each of a complex voltage and a complex current, by multiplying the result of the measurement by the first reference frequency signal and the second reference frequency signal.

A battery management system according to one aspect of the present disclosure includes: the battery management circuit described above; and an integration controller that specifies the frequency of the first reference frequency signal to the battery management circuit. The battery management circuit transmits the real part component and the imaginary part component of each of the complex voltage and the complex current to the integration controller, and the integration controller calculates a complex impedance of the frequency specified, from the real part component and the imaginary part component of each of the complex voltage and the complex current transmitted.

A battery management network according to one aspect of the present disclosure includes: the battery management system described above; and a server device. The service device generates battery information including a result of estimating a state of the secondary battery, based on the measurement information.

Advantageous Effects

A battery management circuit and a battery management system according to one aspect of the present disclosure each make it possible to measure a complex impedance of a secondary battery with high accuracy using a simple circuit configuration.

BRIEF DESCRIPTION OF DRAWINGS

These and other advantages and features become apparent from the following description thereof taken in conjunction with the accompanying Drawings, by way of non-limiting examples of embodiments disclosed herein.

FIG. 3 is a flowchart illustrating a process example of the integration controller according to the embodiment.

FIG. 4 is an explanatory diagram illustrating a structural example of a battery cell according to the embodiment, and an example of an equivalent circuit model.

Figure 1:
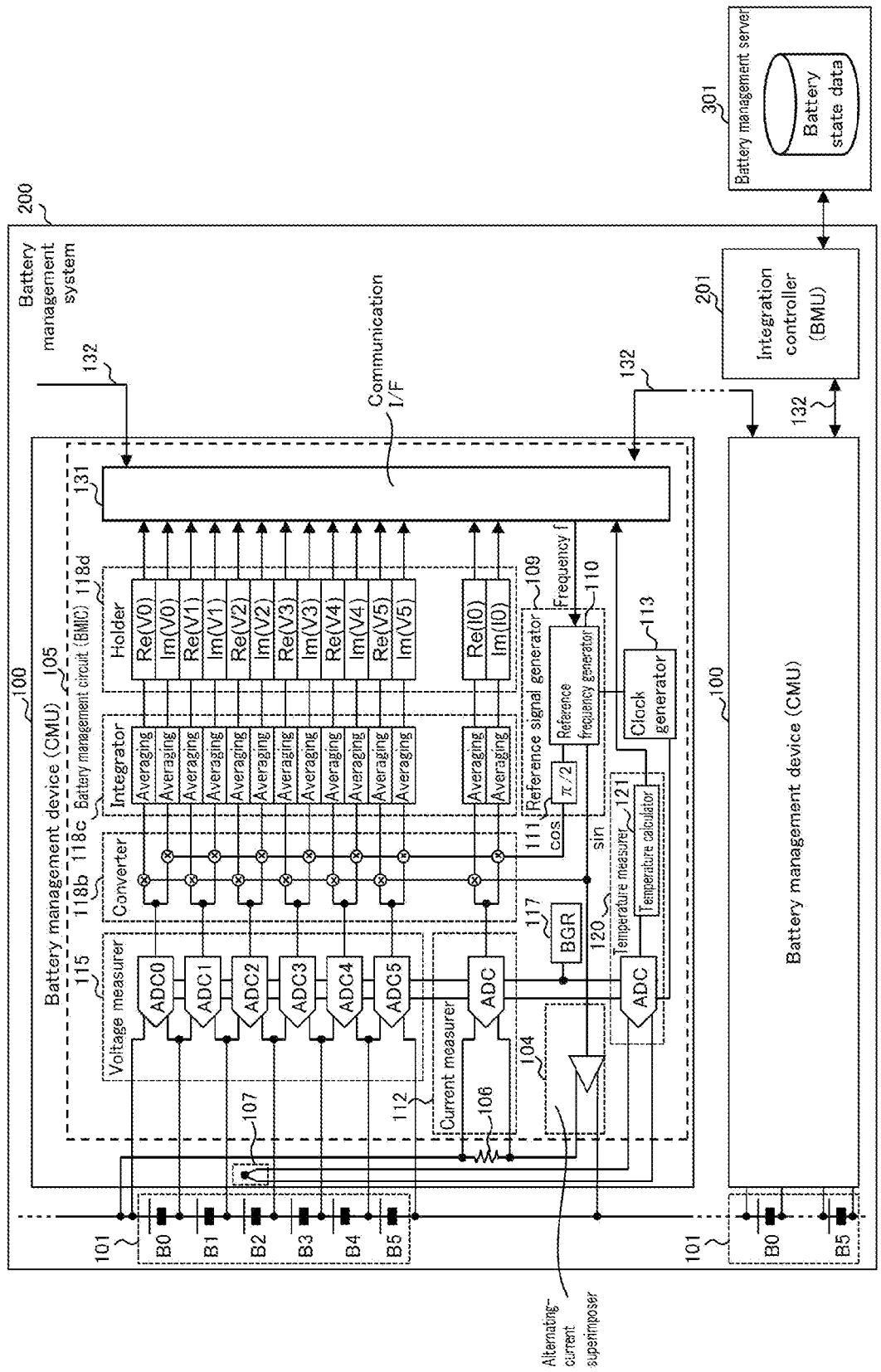
FIG. 1 is a block diagram illustrating a configuration example of a battery management system according to an embodiment, and a battery management server.

DESCRIPTION OF EMBODIMENTS (Underlying Knowledge Forming Basis of the Present Disclosure)

The inventors have found that the following problems arise regarding the secondary battery management devices described in the "Background Art".

When an internal complex impedance (also referred to as an alternating-current impedance) of a secondary battery is measured by an alternating-current superimposition method, generally, a complex voltage that represents, using a complex number, a phase delay of a change in voltage caused by the internal complex impedance is measured with reference to an alternating current to be applied, and the measured complex voltage is divided by the applied current. The alternating current to be applied is a current that is to be amplified based on a reference frequency signal and applied to the secondary battery.

In this method, a phase of the alternating current actually applied to the secondary battery is usually delayed from a phase of a reference frequency signal due to, for example, the influence of electric wiring (e.g., wire harness) connecting the secondary battery and a measuring device, and a drive amplifier that amplifies reference frequency signals.

On the other hand, a voltage is measured by an analog-to-digital (AD) converter that performs sampling using a sampling clock synchronized with a reference frequency signal. Accordingly, since a phase difference between the alternating current actually applied to a secondary battery and a voltage measurement timing appears as a phase error of a complex impedance of the secondary battery, the complex impedance is likely to have an error.

In order to eliminate such a phase error, for example, it is necessary to perform feedback control on the alternating current actually applied to the secondary battery, to cause a frequency of the alternating current to match a frequency of an original reference frequency signal.

However, even this method cannot eliminate a phase error due to frequency characteristics in a feedback group and the influence of a phase error occurring in a stage subsequent to a feedback point.

Moreover, when feedback control is performed, it is necessary to design a feedback group to perform a linear operation. Since an actual complex impedance of a secondary battery is in a range from mere several tens of mΩ to several mΩ, an alternating current to be applied requires a current value of several A to several tens of A, it is extremely difficult to design frequency characteristics of a drive amplifier etc. to have no influence on the feedback group, and consumption current increases.

In view of the above, the present disclosure provides a battery management circuit, a battery management system, and a battery management network that measure a complex impedance of a secondary battery with high accuracy using a simple circuit configuration, without performing feedback control on an alternating current to be applied.

In order to solve such problems, a battery management circuit according to one aspect of the present disclosure manages a secondary battery and includes: a reference signal generator that generates a first reference frequency signal and a second reference frequency signal having a phase different from a phase of the first reference frequency signal; an alternating-current superimposer that superimposes an alternating current on the secondary battery, the alternating current having a frequency component of the first reference frequency signal; a voltage measurer that measures a voltage of the secondary battery by performing sampling using a frequency higher than a frequency of the first reference frequency signal; a current measurer that measures a current of the secondary battery by performing sampling using a frequency higher than the frequency of the first reference frequency signal; and a converter that converts each of results of measurements by the voltage measurer and the current measurer into a real part component and an imaginary part component of each of a complex voltage and a complex current, by multiplying the result of the measurement by the first reference frequency signal and the second reference frequency signal.

Accordingly, it is possible to measure a complex impedance of the secondary battery with high accuracy using a simple circuit configuration, without causing an error in orthogonality between a real part and an imaginary part. To put it another way, by measuring a complex voltage separately for a real part and an imaginary part with respect to a first reference signal and a second reference signal generated to be orthogonal, measuring a complex current separately for a real part and an imaginary part with respect to the first reference signal and the second reference signal, and dividing a measured complex voltage by the complex current measured, orthogonality between the real part and the imaginary part of the complex impedance measured is made dependent only on orthogonality between the first reference signal and the second reference signal. This enables a highly accurate measurement in which a phase error of the complex impedance due to a phase error of a measured voltage and a superimposed current is eliminated.

Moreover, since correcting a phase delay of the superimposed current eliminates the need for feedback control of an alternating current, it is possible to simplify a circuit configuration.

Hereinafter, embodiments will be described with reference to the drawings. Each of the embodiments described below shows a generic or specific example. The numerical values, shapes, materials, constituent elements, arrangement and connection of the constituent elements, steps, and orders of steps, etc. shown in the following embodiments are mere examples, and are not intended to limit the present disclosure. Additionally, the embodiments of the present disclosure are not limited to the current independent claims, and may also be represented by other independent claims.

It should be noted that the respective figures are schematic diagrams and are not necessarily precise illustrations. Furthermore, in the respective figures, the same reference signs are given to substantially the same constituent elements, and overlapping description may be omitted or skipped.

Embodiment 1

[Configuration]

First, a configuration of a battery management system according to Embodiment 1 will be described.

FIG. 1 is a block diagram illustrating a configuration example of battery management system 200 according to the embodiment, and battery management server 301.

Battery management system 200 shown by the figure includes battery packs 101, battery management devices 100, and integration controller 201, integration controller 201 and battery management devices 100 are daisy chained by communication cable 132.

Battery pack 101 is a secondary battery and includes battery cells B0 to B5 connected in series. Each of battery cells B0 to B5 is, for example, a lithium-ion battery, but may be another battery such as a nickel hydride battery. Moreover, battery cells B0 to B5 may be power storage cells connected in series such as a lithium-ion capacitor. Battery pack 101 is connected to a load and a charging circuit. The load is, for example, a motor of an HEV or an EV; however, the present embodiment is not limited to this example. It should be noted that although FIG. 1 shows the example in which battery pack 101 includes the six battery cells, the number of battery cells in battery pack 101 is not limited to six.

Battery management device 100 manages a state of battery pack 101 and is also referred to as a cell management unit (CMU). Battery management device 100 calculates an alternating-current impedance of battery pack 101, specifically, a complex impedance (also referred to as an alternating-current impedance) of each of battery cells B0 to B5. For this purpose, battery management device 100 includes battery management circuit 105 and temperature sensor 107 (e.g., a thermistor).

It should be noted that battery management circuit 105 may be configured as, for example, a one-chip integrated circuit (IC), Moreover, battery management device 100 may be configured as a printed-circuit board (PCB) on which the IC chip of battery management circuit 105 and a temperature sensor are mounted.

Battery management circuit 105 includes alternating-current superimposer 104, reference signal generator 109, current measurer 112, dock generator 113, voltage measurer 115, reference voltage generator 117, converter 118b, integrator 118c, holder 118d, temperature measurer 120, and communication interface 131.

Alternating-current superimposer 104 superimposes an alternating current on the second battery, the alternating current having a frequency component of a first reference frequency signal generated by reference signal generator 109. Alternating-current superimposer 104 shown by FIG. 1 includes a differential buffer that applies the first reference frequency signal as a differential signal to the cathode and the anode of battery pack 101.

Reference signal generator 109 generates the first reference frequency signal and a second reference frequency signal having a phase different from a phase of the first reference frequency signal. For example, the first reference frequency signal is a sine wave signal, and the second reference frequency signal is a cosine wave signal. It should be noted that although it is desirable that the first reference frequency signal and the second reference frequency signal be orthogonal to each other in an acceptable phase error range, the intersection need not be at exactly right angles, and there is a tolerance of angle. Additionally, although calculation becomes extremely complex due to distortion of a complex plane, it is possible to measure a complex impedance using the phases of the first reference frequency signal and the second reference frequency signal at a degree other than 90 degrees, for example, at 45 degrees, and to convert the measured complex impedance into a complex plane in which a real part and an imaginary part are orthogonal to each other.

Moreover, reference signal generator 109 receives specification for frequency f of the first reference frequency signal from integration controller 201 via communication interface 131, and generates the first reference frequency signal in accordance with the specification.

Current measurer 112 measures the alternating current superimposed on battery pack 101, by sampling a current of battery pack 101 using a sampling clock signal from clock generator 113. The current of battery pack 101 is measured as a voltage drop in current sensing resistance element 106 inserted in a path through which the alternating current applied by alternating-current superimposer 104 flows. This voltage drop means an alternating current value since the voltage drop is proportion& to the alternating current. More specifically, current measurer 112 includes an analog-to-digital converter for measuring a current of battery pack 101 that is the secondary battery. This analog-to-digital converter samples a voltage drop in current sensing resistance 106 using a sampling dock signal from dock generator 113, and converts the sampled voltage drop into a digital signal.

Clock generator 113 generates a sampling dock signal having a frequency higher than the frequency of the first reference frequency signal and synchronized with the first reference frequency signal. The sampling dock signal is supplied to current measurer 112 and voltage measurer 115. For example, when a complex impedance of approximately 5 KHz is measured, the frequency of the first reference frequency signal is approximately 5 KHz, and it is necessary to set a sampling dock to satisfy a required phase resolution. Accordingly, in the case where a phase resolution is approximately 1 degree when a measurement frequency is approximately 5 KHz, a sampling dock may have a frequency of approximately 1.8 MHz that is 360 times of 5 KHz.

Voltage measurer 115 measures a voltage of battery pack 101 by sampling the voltage of battery pack 101 using a sampling dock signal from dock generator 113. More specifically, voltage measurer 115 includes the same number of corresponding analog-to-digital converters (ADC0 to ADC5) as battery cells B0 to B5 in battery pack 101. Each of the analog-to-digital converters samples a voltage of a corresponding one of battery cells B0 to B5 using a sampling dock signal from dock generator 113, and converts the sampled voltage into a digital signal. Since voltage measurer 115 uses the same sampling dock as current measurer 112, voltage measurer 115 is capable of performing a highly accurate complex frequency measurement using the minimum phase error between a measurement frequency and the sampling dock.

Reference voltage generator 117 supplies a common reference voltage to the analog-to-digital converters (ADC0 to ADC5) of voltage measurer 115, the analog-to-digital converter of current measurer 112, and an analog-to-digital converter of temperature measurer 120. Reference voltage generator 117 is specifically a bandgap reference (BOAR)

circuit that produces a constant voltage value relative to a variation in temperature and power supply voltage, and generates a voltage of approximately 1.25 V resulting from, for example, a bandgap of silicon. Since the analog-to-digital converters of voltage measurer 115 and the analog-to-digital converter of current measurer 112 use the same reference voltage, the absolute error of the reference voltage is canceled by dividing a numerator by a denominator when a complex impedance is calculated. For this reason, it is possible to measure the complex impedance with high accuracy.

Converter 118*b* converts each of results of measurements by voltage measurer 115 and current measurer 112 into a real part component and an imaginary part component of each of a complex voltage and a complex current, by multiplying the result of the measurement by the first reference frequency signal and the second reference frequency signal. For this purpose, converter 118*b* includes the same number of corresponding multiplier pairs as the analog-to-digital converters (ADC0 to ADC5) of voltage measurer 115, and a multiplier pair corresponding to the analog-to-digital converter of current measurer 112. Each of the multiplier pairs corresponding to voltage measurer 115 includes a multiplier that multiplies a result of a conversion (i.e., a sampled digital voltage value) by a corresponding one of the analog-to-digital converters by the first reference frequency signal, and a multiplier that multiplies the result of the conversion by the second reference frequency signal. A result of the multiplication by the former indicates a real part component when a sampled voltage is expressed as a complex voltage. A result of the multiplication by the latter indicates an imaginary part component when the sampled voltage is expressed as the complex voltage. The multiplier pair corresponding to current measurer 112 includes a multiplier that multiplies a result of a conversion (i.e., a sampled digital current value) by a corresponding one of the analog-to-digital converters by the first reference frequency signal, and a multiplier that multiplies the result of the conversion by the second reference frequency signal. A result of the multiplication by the former indicates a real part component when a sampled current is expressed as a complex current. A result of the multiplication by the latter indicates an imaginary part component when the sampled current is expressed as the complex current.

It should be noted that each of the analog-to-digital converter (ADC0 to ADC5) may be, for example, a delta-sigma analog-to-digital converter. Moreover, the analog-to-digital converters (ADC0 to ADC5) have the same analog-to-digital conversion characteristics. The analog-to-digit& conversion characteristics are various types of parameters such as a resolution (a bit count). The analog-to-digital converters (ADC0 to ADC5) are identical analog-to-digital converters. This makes it possible to reduce measurement errors resulting from a difference in conversion time (latency) due to a difference in type of the analog-to-digital converters, which occur among battery cells B0 to B5.

Integrator 118*c* averages real part components and imaginary part components of complex voltages and complex currents, respectively, the real part components and the imaginary part components resulting from repeated measurements by voltage measurer 115 and current measurer 112 and conversions by converter 118*b*. This averaging also makes it possible to reduce errors in measuring the complex voltages and the complex currents, and it is possible to increase a resolution (a measurement accuracy) using oversampling. The averaging further allows measurements to be highly accurate. More specifically, integrator 118*c* includes the same number of corresponding averaging circuit pairs as the multiplier pairs of converter 118*b*. Each of the averaging circuit pairs includes an averaging circuit that averages real part components of complex voltages or complex currents, and an averaging circuit that averages imaginary part components of complex voltages or complex currents. When a battery cell is a lithium-ion battery, an internal complex impedance is, for example, several mΩ. Assuming that an alternating current to be superimposed is 1 A, a change in output voltage is merely several mv. On the other hand, since the lithium-ion battery has a DC output voltage of approximately 3.4 V, a dynamic range needs to be from 4 V to approximately 5 V in order for an analog-to-digital converter connected to the battery cell to measure a voltage. In this case, when a complex impedance measurement accuracy requires approximately 8 bits, an analog-to-digital converter having effective bits of approximately 18 to 20 bits becomes necessary, but a high-resolution AD converter requires a great amount of power and a large area. In contrast, since an internal complex impedance measured for performing an electrochemical impedance analysis of the lithium-ion battery is measured in a low-frequency range from 0.01 Hz, which is substantially close to DC, to several tens of KHz, a complex voltage cannot be measured in a state of AC connection. The configuration shown by FIG. 1 allows integrator 118*c* to increase a resolution using oversampling, by repeatedly applying an alternating current and separately averaging real parts and imaginary parts of complex voltages and complex currents, respectively, which enables even an analog-to-digital converter having a small bit count (e.g., approximately 16 bits) to obtain a complex impedance measurement result having an accuracy of 20 to 24 bits. Accordingly, an increase in complex voltage measurement accuracy can lead to reduction of a magnitude of an alternating current to be applied, which makes it easy to measure a secondary battery having a large capacity and a small internal complex impedance.

Holder 118*d* holds the averaged real part components and imaginary part components of the complex voltages and the complex currents. For this purpose, holder 118*d* includes the same number of register pairs for holding complex voltages as the battery cells of battery pack 101, and a register pair for holding complex currents. Each of the register pairs for holding the complex voltages includes a register that holds a real part component (Re(Vi)) of a complex voltage of a corresponding one of the battery cells, and a register that holds an imaginary part component (Im(Vi)) of the complex voltage, Here, i is an integer from 0 to 5. Moreover, the register pair for holding the complex currents includes a register that holds a real part component (Re(I0)) of a complex current of corresponding battery pack 101, and a register that holds an imaginary part component (Im(I0)) of the complex current.

Temperature measurer 120 measures a temperature of battery pack 101 using temperature sensor 107 provided to battery pack 101. Temperature sensor 107 may be, for example, a thermistor, but may be a temperature sensor including another element such as a thermocouple. Specifically, temperature measurer 120 includes an analog-to-digital converter and temperature calculator 121. This analog-to-digital converter samples a voltage of temperature sensor 107 and converts the sampled voltage into a digital value. Temperature calculator 121 calculates a temperature corresponding to the digital voltage from the analog-to-digital converter.

Communication interface 131 is a communication circuit that allows battery management circuit 105 to communicate with another battery management device 100 or integration controller 201. Communication interface 131 is used by, for example, holder 118*d* to transmit a calculated complex impedance to integration controller 201, The communication performed by communication interface 131 may be a wireless communication or a wired communication. The communication standards of the communication performed by communication interface 131 are not particularly limited.

Integration controller 201 specifies frequency f of the first reference frequency signal to battery management devices 100, collects the real part components and the imaginary part components held in holders 118*d* from battery management devices 100 via communication cable 132, and calculates complex impedances corresponding to the specified frequency, from the collected real part components and imaginary part components of respective complex voltages and complex currents. In the calculating of the impedances, alternating-current impedances are calculated by dividing the complex voltages held in holders 118*d* by the corresponding complex currents. Specifically, integration controller 201 has a division function and calculates, for example, an alternating-current impedance of battery cell B0 by dividing the complex voltage indicated by (Re(V0), Im(V0)) by the complex current indicated by (Re(I0), Im(I0)).

Battery management device 100 is a low-order cell management unit (CMU) that measures and manages individual battery cells. In contrast, integration controller 201 is a high-order battery management unit (BMU) that manages the entirety of a battery pack. Integration controller 201 includes a microcontroller unit (MCU) that enables higher-speed and larger-capacity computing than battery management device 100 does, and performs battery control. In the configuration shown by FIG. 1, battery management device 100, the CMU, is limited to measure complex voltages and complex currents, and high-order integration controller 201 having a higher calculation capability calculates complex impedances. This makes it possible to achieve complex impedance measurement at low cost by eliminating the need for including an arithmetic circuit that calculates complex impedances in CMUs in the complex impedance measurement, and simplifying the circuits of the CMUs. Moreover, this also makes it easy to perform computing and correction such as temperature correction of a variation in complex impedance due to a measurement temperature and reduction of a measurement time by decimating and interpolating measurement frequency intervals, etc., by integration controller 201 collecting complex voltages and complex currents.

Next, a configuration example of integration controller 201 will be described.

Figure 2:
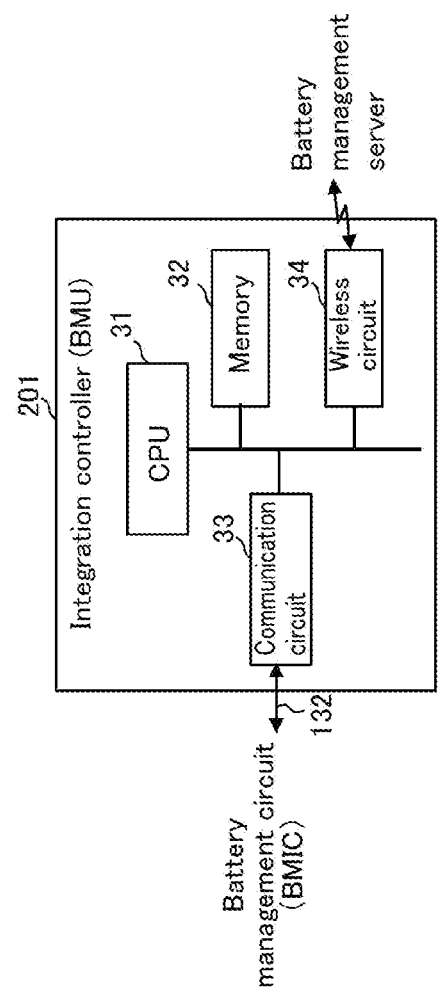
FIG. 2 is a diagram illustrating a configuration example of an integration controller according to the embodiment.

FIG. 2 is a diagram illustrating a configuration example of integration controller 201 according to the embodiment.

As shown by the figure, integration controller 201 includes CPU 31, memory 32, communication circuit 33, and wireless circuit 34.

CPU 31 executes a program stored in memory 32.

Memory 32 stores various programs for managing battery management devices 100, and various data such as battery state data including an alternating-current impedance of battery pack 101.

Communication circuit 33 communicates with battery management devices 100 daisy chained by communication cable 132.

Wireless circuit 34 wirelessly communicates with battery management server 301.

[Operation]

Subsequently, a specific process example of integration controller 201 will be described.

FIG. 3 is a flowchart illustrating a process example of integration controller 201 according to the embodiment.

The figure shows a process example of one battery management device 100 among battery management devices 100. Integration controller 201 sequentially performs the same process on other battery management devices 100.

First, integration controller 201 specifies frequency f of a first reference frequency signal to battery management device 100 (511). Accordingly, battery management device 100 generates the first reference frequency signal having the specified frequency and measures a complex voltage, a complex current, and a temperature of battery pack 101 that is a secondary battery. When these measurements are completed, integration controller 201 obtains data indicating the measured complex voltage, complex current, and temperature of battery pack 101 from battery management device 100 via communication cable 132 (S12 to S14). It should be noted that instead of obtaining a temperature of battery pack 101, a temperature of the secondary battery at the time of measurement may be estimated from a calculated complex impedance, a previously converted complex impedance, and information indicating a temperature of the secondary battery. This estimation is helpful for battery management device 100 without temperature sensor 107.

Next, integration controller 201 calculates a complex impedance corresponding to the specified frequency, from a real part component and an imaginary part component of each of the complex voltage and the complex current in the obtained data (S15). It should be noted that integration controller 201 may specify frequency f of the first reference frequency signal multiple times while changing frequency f of the first reference frequency signal, and calculate a change in complex impedance corresponding to a change in the specified frequency.

Then, integration controller 201 generates drawing data indicating a Cole-Cole plot in which a locus of a complex impedance is traced on a complex plane (S16). It should be noted that integration controller 201 may generate drawing data indicating a Bode plot in which a complex impedance is converted into a magnitude and a phase, instead of drawing data indicating a Cole-Cole plot.

After that, integration controller 201 normalizes the complex impedance, based on the obtained temperature (or the estimated temperature) (S17). Specifically, integration controller 201 converts the complex impedance into a complex impedance corresponding to a predetermined temperature, based on the obtained temperature. It should be noted that steps S16 and S17 may be rearranged in a different order. In other words, integration controller 201 may generate drawing data after normalization based on a temperature.

Then, integration controller 201 calculates an element constant of circuit elements, such as resistors R and capacitors C, constituting an equivalent circuit model representing a corresponding battery cell, based on the complex impedance corresponding to the predetermined temperature (i.e., which is corrected based on a standard temperature different from a measurement temperature) (S18).

Next, integration controller 201 generates measurement information including the complex impedance and the element constant and adds identification information for identifying the corresponding battery cell to the measurement information (S19). After that, integration controller 201 further adds information indicating the current time and an operating time to the measurement information (S20).

Finally, integration controller 201 transmits, as battery state data, the measurement information to which the identification information, the current time, and the operating time have been added, to battery management server 301 via a network (S21).

Next, an example of an equivalent circuit model of a battery cell and an example of an element constant of the equivalent circuit model will be described.

FIG. 4 is an explanatory diagram illustrating a structural example of a battery cell according to the embodiment, and an example of an equivalent circuit model. (a) in FIG. 4 shows a symbol of battery cell B0. (b) in FIG. 4 schematically shows a structural example when battery cell B0 is a lithium-ion battery. Battery cell B0 includes, as conditions for an equivalent circuit model, an anode, an anode material, an electrolyte, a separator, a cathode material, and a cathode. (c) in FIG. 4 shows one example of the equivalent circuit model of battery cell B0. This equivalent circuit model includes induction component L0, resistance components R0 to R2, capacitance components C1 and C2, and lithium-ion diffusion resistance component Zw. Induction component L0 indicates an impedance component of electrode wire. Resistance component R0 indicates an impedance component of the electrolyte. A parallel circuit of resistance component R1 and capacitance component C1 indicates an impedance component of the anode. A circuit portion including resistance component R2, lithium-ion diffusion resistance component Zw, and capacitance component C2 indicates an impedance component of the cathode. Lithium-ion diffusion resistance component Zw is known as a Warburg impedance.

A state of battery cell B0 can be estimated by calculating an element constant of each of circuit elements constituting such an equivalent circuit model. For example, a degraded state of battery cell B0 can be estimated based on a chronological change in element constant.

Next, a characteristic example of a complex impedance of a battery cell will be described.

Figure 5A:
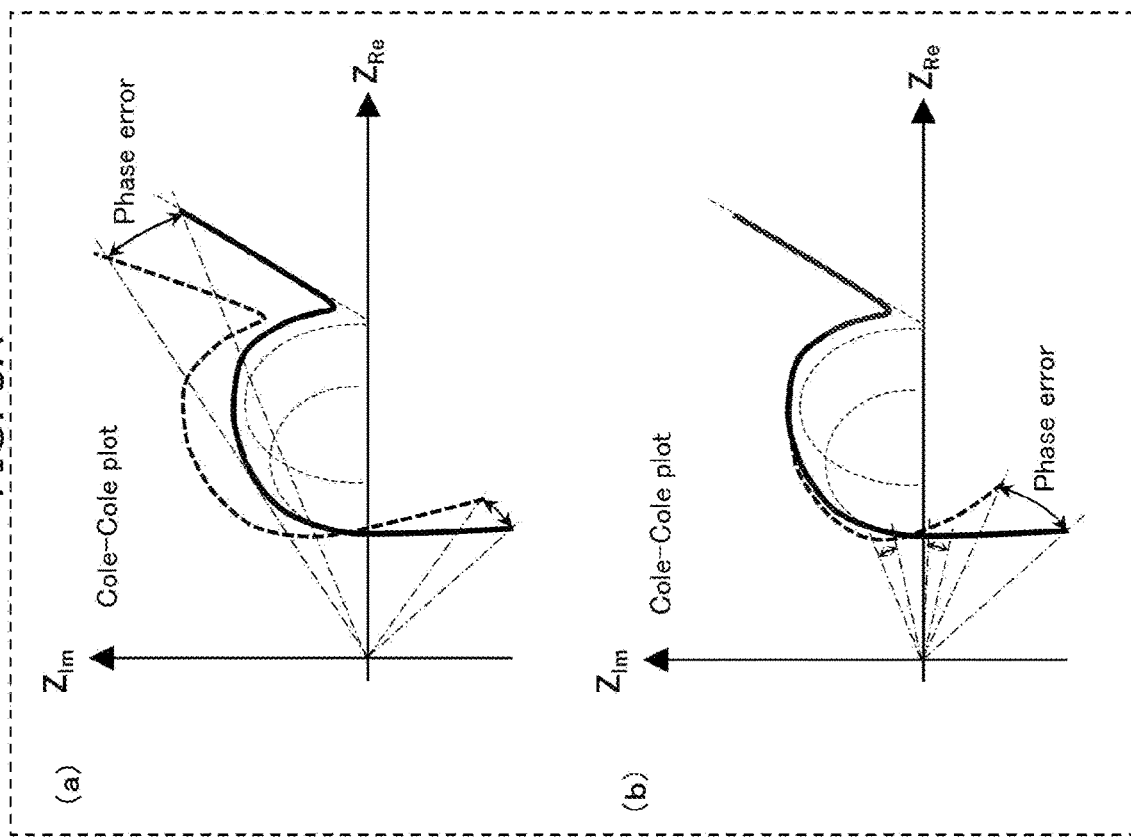
FIG. 5A is a Cole-Cole plot illustrating an example of a complex impedance of a battery cell according to the embodiment.

FIG. 5A is a Cole-Cole plot illustrating an example of a complex impedance of a battery cell according to the embodiment. The thick solid line shown by each of (a) and (b) in FIG. 5A shows an example of an accurate complex impedance without a phase error. The thick broken line shown by (a) in FIG. 5A shows an example of a complex impedance when a phase error occurs due to a fixed angle. Additionally, the thick broken line shown by (b) in FIG. 5A shows an example of a complex impedance when a phase error occurs due to a fixed delay time.

A Cole-Cole plot is also referred to as a complex plane diagram or a Nyquist plot. The thick solid line shown by each of (a) and (b) in FIG. 5A corresponds to the equivalent circuit model shown by (c) in FIG. 4. It is generally known that, in a method of superimposing an alternating current to calculate a complex impedance of a battery cell, a complex impedance is represented by an equivalent circuit in which a resistor and a capacitor are disposed parallel to each other in the case of charge-transfer limiting, and the complex impedance has a semicircular shape on a complex plane. In addition, if the complex impedance includes a Warburg impedance, it is generally known that the complex impedance is represented by a straight line extending from some portion (a neighborhood of the upper right portion) of the semicircle obliquely upward at a slope of 45 degrees as a slope derived from the Warburg impedance.

In calculation of a complex impedance, the presence of a phase error in a voltage and current measuring system appears as a phase error of a complex impedance. Generally speaking, a phase error caused by the measuring system often has frequency characteristics, and a problem arises when complex impedances are measured using different frequencies. Especially, when a complex impedance corresponding to each of frequencies is drawn on a Cole-Cole plot while changing the frequency, each of frequency phase errors appears as a quadrature error of a real axis (the horizontal axis) and an imaginary axis (the vertical axis) on a complex plane of the Cole-Cole plot. For this reason, it is difficult to draw an accurate Cole-Cole plot. The configuration shown by FIG. 1, however, makes it possible to draw an accurate Cole-Cole plot by measuring a complex voltage and a complex current and calculating a complex impedance to greatly reduce a phase error of a voltage and current measuring system. When an angle of a phase error is fixed as with the thick broken line shown by (a) in FIG. 5A, a Cole-Cole plot is characterized by rotating around the origin. Moreover, when a delay time of a phase error is fixed as with the thick broken line shown by (b) in FIG. 5A, a Cole-Cole plot is characterized by rotating only on a high-frequency side and overlapping the thick solid line on a low-frequency side. To put it another way, the Cole-Cole plot is characterized in that the phase error occurs only on the high-frequency side and does not occur on the low-frequency side.

Figure 5B:
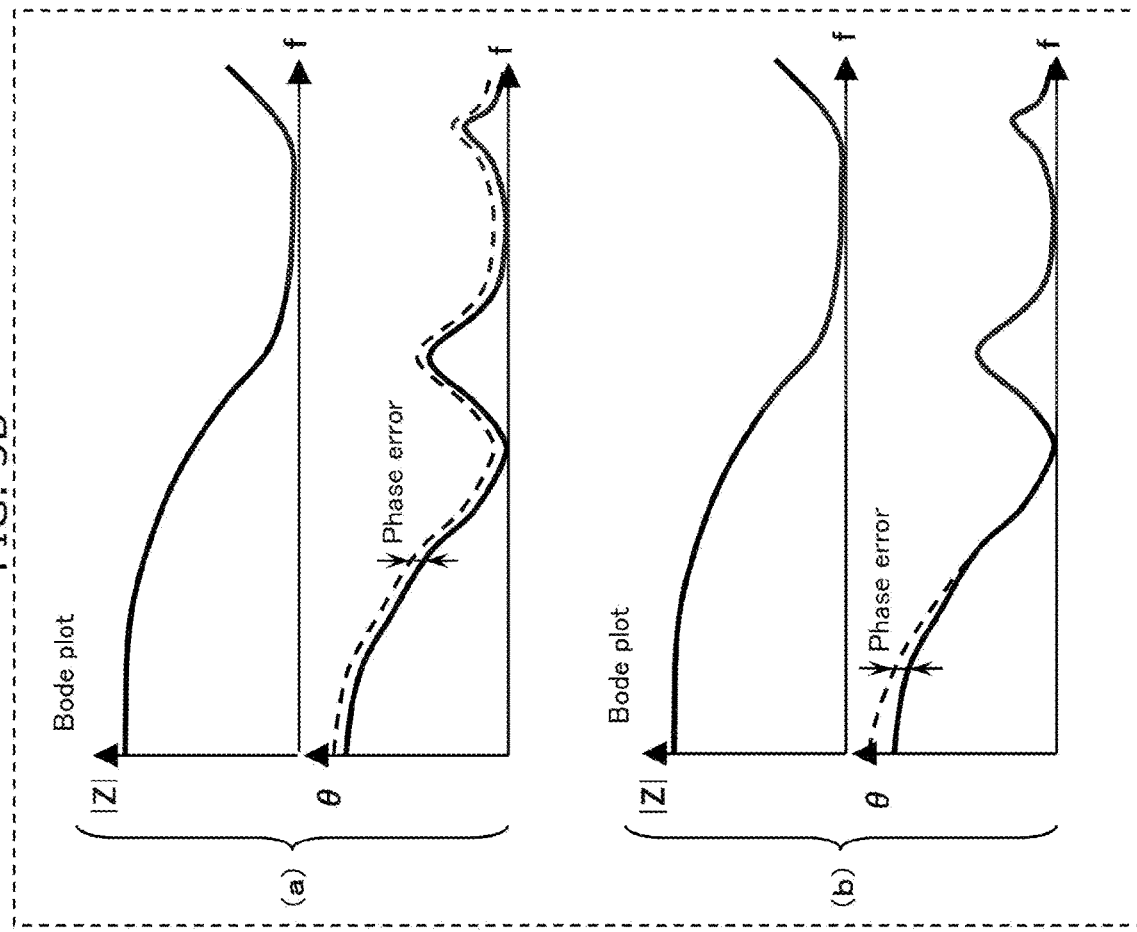
FIG. 5B is a Bode plot illustrating an example of a complex impedance of a battery cell according to the embodiment.

FIG. 5B is a Bode plot illustrating an example of a complex impedance of a battery cell according to the embodiment. The thick solid line shown by the upper part of each of (a) and (b) in FIG. 5B indicates an example of a magnitude of an accurate complex impedance without a phase error relative to a frequency. The thick solid line shown by the lower part of each of (a) and (b) in FIG. 5B indicates an example of phase θ of an accurate complex impedance without a phase error relative to a frequency.

The thick broken line shown by the lower part of (a) in FIG. 5B indicates an example of phase θ of a complex impedance when a phase error occurs due to a fixed angle, relative to a frequency. The thick broken line shown by the lower part of (b) in FIG. 53 indicates an example of phase B of a complex impedance when a phase error occurs due to a fixed delay time, relative to a frequency. The thick solid line shown by each of (a) and (b) in FIG. 5b corresponds to the equivalent circuit model shown by (c) in FIG. 4.

When a complex impedance is drawn as a Bode plot, in which the complex impedance is represented by a magnitude and a phase, while changing a frequency, the presence of a phase error in a voltage and current measuring system appears as a phase error on the Bode plot. For this reason, it is difficult to draw an accurate complex impedance as a Bode plot. The configuration shown by FIG. 1, however, makes it possible to draw an accurate Bode plot by measuring a complex voltage and a complex current and calculating a complex impedance to greatly reduce a phase error of a voltage and current measuring system. When an angle of a phase error is fixed as with the thick broken line shown by the lower part of (a) in FIG. 5B, a Bode plot showing a phase relative to a frequency is characterized by being translated parallel. Moreover, when a delay time of a phase error is fixed as with the thick broken line shown by the lower part of (b) in FIG. 5B, a Bode plot showing a phase relative to a frequency is characterized by being subject to an influence only on a high-frequency side and overlapping the thick solid line on a low-frequency side. In other words, the Bode plot is characterized in that the phase error occurs only on the high-frequency side and does not occur on the low-frequency side.

FIG. 5A and FIG. 5B are useful for estimating a state of a battery cell. For example, the thick solid lines shown by FIG. 5A are assumed to extend rightward as a battery cell is further degraded. The thick solid lines shown by the upper part of FIG. 5B are assumed to extend upward as a battery cell is further degraded.

Next, temperature characteristics of a battery cell will be described.

Figure 6:
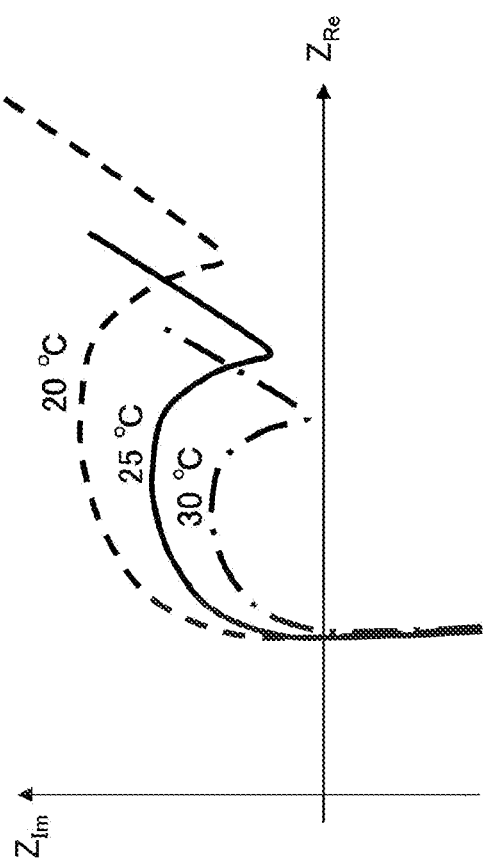
FIG. 6 is a diagram illustrating an example of temperature characteristics of a complex impedance of a battery cell according to the embodiment.

FIG. 6 is a diagram illustrating an example of temperature characteristics of a complex impedance of a battery cell according to the embodiment. The figure shows a Cole-Cole plot when the battery cell has a temperature of 20 degrees Celsius, 25 degrees Celsius, or 30 degrees Celsius. Although the complex impedance of the battery cell has the temperature dependency as became dear above, the influence of the temperature dependency can be reduced by normalization that converts the complex impedance into a complex impedance corresponding to a predetermined temperature.

As above, battery management circuit 105 is capable of measuring the complex impedance of each battery cell of battery pack 101 with high accuracy using the simple circuit configuration.

As describe above, battery management circuit 105 according to Embodiment 1 manages a secondary battery and includes: reference signal generator 109 that generates a first reference frequency signal and a second reference frequency signal having a phase different from a phase of the first reference frequency signal; alternating-current superimpose 104 that superimposes an alternating current on the secondary battery, the alternating current having a frequency component of the first reference frequency signal; voltage measurer 115 that measures a voltage of the secondary battery by performing sampling using a frequency higher than a frequency of the first reference frequency signal; current measurer 112 that measures a current of the secondary battery by performing sampling using a frequency higher than the frequency of the first reference frequency signal; and converter 118b that converts each of results of measurements by voltage measurer 115 and current measurer 112 into a real part component and an imaginary part component of each of a complex voltage and a complex current, by multiplying the result of the measurement by the first reference frequency signal and the second reference frequency signal.

This configuration makes it possible to measure a complex impedance of a secondary battery with high accuracy using a simple circuit configuration.

Here, battery management circuit 105 may include clock generator 113 that generates a sampling clock signal synchronized at the frequency higher than the frequency of the first reference frequency signal, and voltage measurer 115 and current measurer 112 may perform sampling using the sampling clock signal generated by clock generator 113.

It should be noted that clock generator 113 may generate a single sampling clock signal or sampling clock signals.

Moreover, the sampling clock signals may be synchronized with the first reference frequency signal or need not be synchronized with the first reference frequency signal. Even if a sampling clock signal is not synchronized with the first reference frequency signal, voltage measurer 115 and current measurer 112 are capable of measuring a voltage and a current with accuracy, respectively, as long as a frequency of the sampling clock signal is sufficiently higher than the frequency of the first reference frequency signal.

Voltage measurer 115 and current measurer 112 may use the same sampling clock signal or different sampling clock signals. In other words, sampling signals for voltage measurement and current measurement may be identical sampling dock signals or different sampling clock signals. Even if different sampling dock signals are used, it is possible to perform a measurement equivalent to when the same sampling clock signal is used, as long as frequencies of the different sampling dock signals is sufficiently higher than the frequency of the first reference frequency signal.

Here, voltage measurer 115 and current measurer 112 may repeatedly measure a voltage and a current of the secondary battery, and battery management circuit 105 may include an integrator that averages real part components and imaginary components of complex voltages and complex currents, respectively, the complex voltages and the complex currents corresponding to the repeated measurements.

This configuration makes it possible to increase a voltage measurement resolution and a current measurement resolution by averaging, and increase a measurement accuracy. An increase in complex voltage measurement accuracy can lead to reduction of a magnitude of an alternating current to be applied, which makes it easy to measure a secondary battery having a large capacity and a small internal complex impedance.

Here, voltage measurer 115 may include at least one analog-to-digital converter for measuring a voltage of the secondary battery, current measurer 112 may include an analog-to-digital converter for measuring a current of the secondary battery, and battery management circuit 105 may include reference voltage circuit 117 that supplies a common reference voltage to the at least one analog-to-digital converter of voltage measurer 115 and the analog-to-digital converter of current measurer 112.

For example, even an analog-to-digital converter having a small bit count (e.g., approximately 16 bits) is capable of obtaining a complex impedance measurement result having an accuracy of 20 to 24 bits. Additionally, since the same reference voltage is used for voltage measurement and current measurement, in calculation of a complex impedance, that is, in division of a measured voltage by a measured current, the absolute error of the reference voltage appears both in the denominator and the numerator and is canceled. For this reason, it is possible to measure the complex impedance with high accuracy.

Here, battery pack 101, which is the secondary battery, may include battery cells connected in series, and voltage measurer 115 may include, as at least one analog-to-digital converter, as many analog-to-digital converters as the battery cells and measure a voltage of each of the battery cells.

With this configuration, the same number of the analog-to-digital converters as the battery cells makes it possible to simultaneously measure voltages and currents of the battery cells in parallel. Even when a temperature rapidly changes, it is possible to perform measurement with accuracy.

Here, battery management circuit 105 may include a single semiconductor integrated circuit (BMIC).

With this configuration, the integration of battery management device 100 into a circuit makes it easy to reduce costs.

Battery management system 200 according to Embodiment 1 includes: battery management circuit 105 described above; and integration controller 201 that specifies the frequency of the first reference frequency signal to battery management circuit 100. Battery management circuit 100 transmits the real part component and the imaginary part component of each of the complex voltage and the complex current to integration controller 201, and integration controller 201 calculates a complex impedance of the frequency specified, from the real part component and the imaginary part component of each of the complex voltage and the complex current transmitted.

Here, battery management system 200 may include: at least one battery management circuit 105; and communication cable 132 that daisy chains integration controller 201 and at least one battery management circuit 105. Integration controller 201 collects the real part component and the imaginary part component from at least one battery management circuit 105 via communication cable 132.

With this configuration, integration controller 201 is a high-order system that manages the entirety of a battery pack, and calculates a complex impedance using the complex voltage and complex current measured by battery management circuit 105. This simplifies the circuit configuration of battery management circuit 105 in complex impedance measurement, which makes it possible to reduce costs. Moreover, this also makes it easy to perform a more highly accurate correction on a measurement error and a variation in measurement temperature, etc., by integration controller 201 collecting complex voltages and complex currents.

Here, integration controller 201 may specify the frequency of the first reference frequency signal multiple times while changing the frequency of the first reference frequency signal, and calculate a change in the complex impedance corresponding to a change in the frequency specified.

This configuration makes it possible to calculate a change in complex impedance corresponding to a change in frequency under the control of integration controller 201.

Here, integration controller 201 may generate drawing data indicating a Cole-Cole plot in which a locus of a complex impedance is traced on a complex plane.

Here, integration controller 201 may generate drawing data indicating a Bode plot in which a complex impedance is converted into a magnitude and a phase.

This configuration makes it easy to estimate a state (e.g., a degraded state) of the battery cell using a Cole-Cole plot or a Bode plot for the secondary battery.

Here, integration controller 201 may obtain a temperature of the secondary battery and convert the complex impedance into a complex impedance corresponding to a predetermined temperature, based on the temperature obtained.

This configuration makes it possible to reduce the influence of the temperature dependency of the complex impedance of the secondary battery.

Here, integration controller 201 may estimate a temperature of the secondary battery at a time of measurement, from the complex impedance calculated, a previously converted complex impedance, and information indicating a temperature of the secondary battery.

This configuration allows a battery management device to estimate a temperature of the secondary battery at the time of measurement even if the battery management device does not include a temperature sensor.

Here, integration controller 201 may calculate an element constant of circuit elements constituting an equivalent circuit model representing the secondary battery, based on the complex impedance corresponding to the predetermined temperature.

This configuration makes it possible to estimate a state using the equivalent circuit model of the secondary battery.

Here, integration controller 201 may add identification information for identifying the secondary battery to measurement information including the complex impedance calculated, and transmit the measurement information to which the identification information has been added to a server device via a network.

This configuration allows battery management system 200 to perform battery management in cooperation with a server device (battery management server 301).

Here, integration controller 201 may receive battery information from the server device, the battery information including a result of estimating a state of the secondary battery based on the measurement information.

Embodiment 2

Next, a configuration example of a battery management network when battery management server 301 is what is called a cloud server device will be described.

Figure 7:
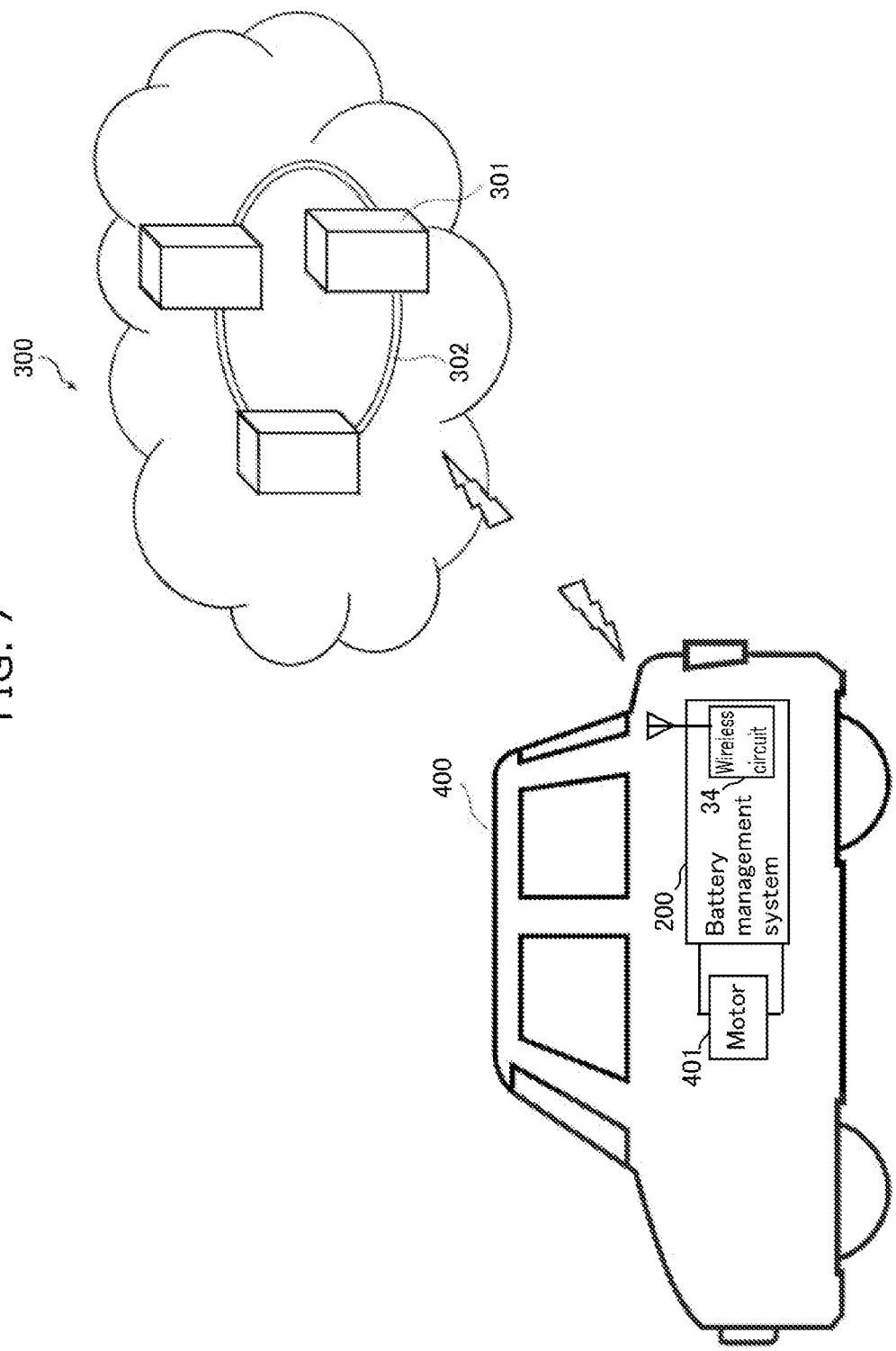
FIG. 7 is a block diagram illustrating a configuration example of a battery management network according to another embodiment.

FIG. 7 is a block diagram illustrating a configuration example of a battery management network according to Embodiment 2. The battery management network shown by the figure includes vehicle 400 and cloud system 300.

Vehicle 400 includes battery management system 200 and motor 401.

Battery management system 200 has been described in Embodiment 1. Integration controller 201 shown by FIG. 7 communicates with a server device of cloud system 300 via wireless circuit 34. It should be noted that a relay device may lie between circuit 34 and server device 301.

Cloud system 300 is a server device group on a network including server device 301. Battery management server 301 is a server device located away from battery management system 200. Server device 301 is what is called a cloud server.

Figure 8:
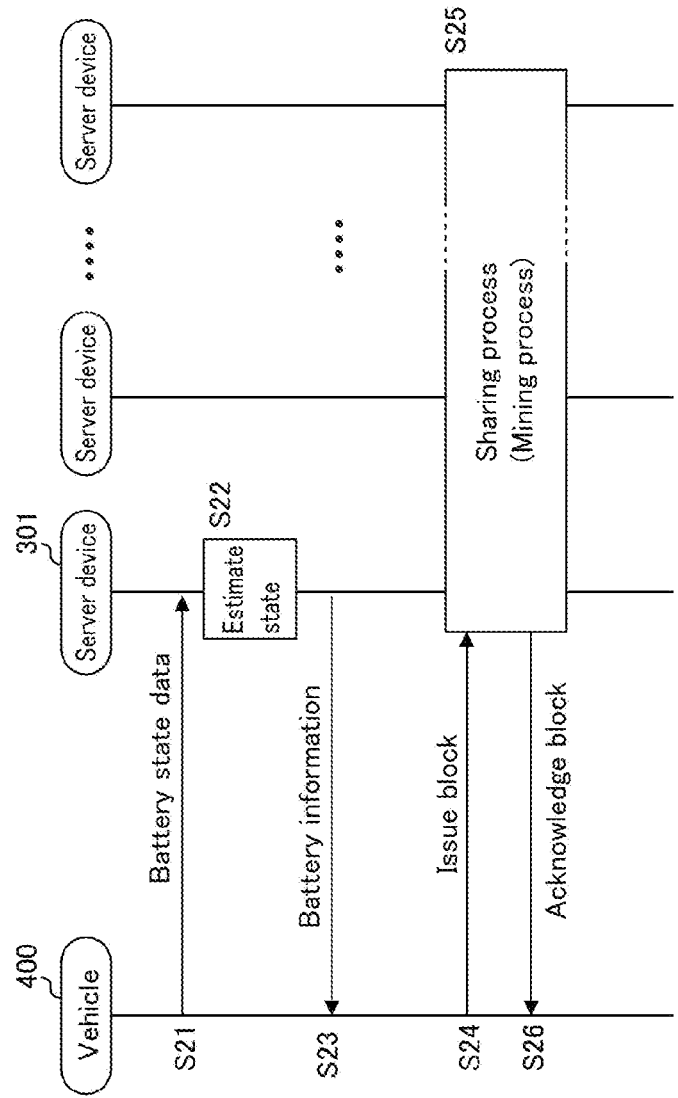
FIG. 8 is a sequence diagram illustrating a process example of the battery management network according to the other embodiment.

FIG. 8 is a sequence diagram illustrating a process example of the battery management network according to the present embodiment.

As described in Embodiment 1, battery management system 200 of vehicle 400 adds identification information for identifying a secondary battery to measurement information including a calculated complex impedance, and transmits, as battery state data, the measurement information to which the identification information has been added, to server device 301 via the network (S21).

Battery management server 301 estimates a state of the secondary battery, based on the battery state data (S22), and generates battery information including a result of the estimation. Examples of a state of the secondary battery include a state of charge, a degraded state, and an operating history of the battery. Moreover, server device 301 transmits the battery information including the result of the estimation, to vehicle 400 (S23).

Battery management system 200 issues a block to transmit block data including the measurement information or battery information to server device 301 (S24).

Battery management server 301 performs a sharing process for causing a cloud server device group to share the issued block data (S25). The sharing process may be, for example, what is called a mining process. The cloud server device group shares an aggregate of block data as a blockchain, performs a process for connecting the block data issued from vehicle 400 to the blockchain (i.e., the mining process), and performs state estimation and degradation diagnosis.

After the completion of the process for connecting to the blockchain, battery management server 301 transmits data indicating an acknowledgement of the block, to vehicle 400 (S26).

As described above, server device 301 according to Embodiment 2 is included in the server device group that shares battery information on the network.

This configuration makes it possible to implement cloud battery telematics. Here, the cloud battery telematics refers to battery management performed, as part of information service for making various information available, using a cloud server system and battery management system 200 that is installed in a vehicle and connectable to a network.

Here, integration controller 201 may cause the server device group to share an aggregate of block data including the measurement information or the battery information, by transmitting the block data to the server device.

This configuration enables the server device group to jointly manage the block data including the measurement information or battery information. For example, the management of block data by the server device group using a blockchain technique makes it possible to manage battery information securely.

[Variation]

Next, a variation of battery management system 200 according to Embodiments 1 and 2 will be described.

Figure 9:
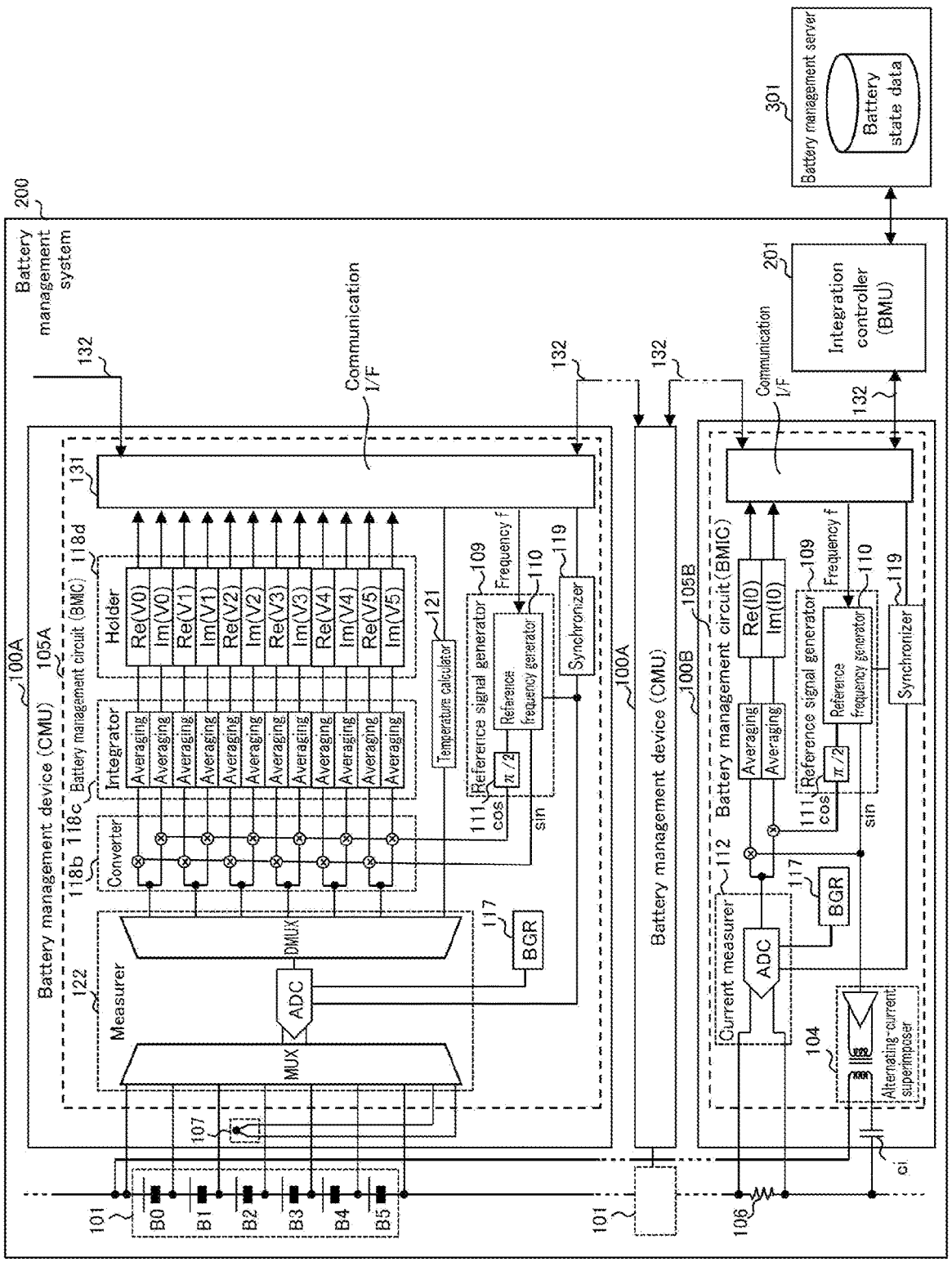
FIG. 9 is a block diagram illustrating a configuration example of a battery management system according to a variation, and a battery management server.

FIG. 9 is a block diagram illustrating a configuration example of a battery management system according to a variation, and a battery management server.

The figure differs from FIG. 1 in that instead of battery management circuit 105, battery management circuit 105A (a first semiconductor integrated circuit) and battery management circuit 105B (a second semiconductor integrated circuit) are included. The following mainly describes the differences. Battery management circuit 105, a one-chip semiconductor integrated circuit, is divided into two semiconductor integrated circuits. Moreover, the circuit configurations of current measurer 112 and voltage measurer 115 are simplified.

Battery management circuit 105A differs from battery management device 100 mainly in including measurer 122 that measures a voltage, a first reference signal generator that is reference signal generator 109, and first signal synchronizer 119.

Battery management circuit 105B includes current measurer 112, first signal synchronizer 119, a second reference signal generator that is equivalent to reference signal generator 109, and second signal synchronizer 119.

First signal synchronizer 119 causes the first reference signal generator to perform phase matching between the first reference frequency signal in battery management circuit 105A and the first reference frequency signal in battery management circuit 105B.

Second signal synchronizer 119 causes the second reference signal generator to perform phase matching between the first reference frequency signal in battery management circuit 105A and the first reference frequency signal in battery management circuit 105B.

Measurer 122 includes a multiplexer (MUX) that selects a single battery cell from battery cells, a single analog-to-digital converter that measures a voltage of the single battery cell selected by the multiplexer, and a demultiplexer that distributes a result of conversion by the single analog-to-digital converter. Measurer 122 sequentially selects a single battery cell from battery cells and measures a voltage of the single battery cell. In addition, measurer 122 also measures a temperature of the single battery cell.

As stated above, in battery management system 200 according to the present variation, the secondary battery includes battery cells that are connected in series, battery management circuit 105 includes the multiplexer that selects a single battery cell from the battery cells, and the at least one analog-to-digital converter of voltage measurer 115 is a single analog-to-digital converter that measures a voltage of the battery cell selected by the multiplexer.

With this configuration, a single analog-to-digital converter is capable of sequentially measuring voltages and currents of battery cells, which makes it possible to simplify a circuit configuration.

Here, battery management circuit 105 may include a first semiconductor integrated circuit (battery management circuit 105A) and a second semiconductor integrated circuit (battery management circuit 105B). The first semiconductor integrated circuit may include voltage measurer 115, a first reference signal generator that is reference signal generator 109, and first signal synchronizer 119. The second semiconductor integrated circuit may include current measurer 112, a second reference signal generator equivalent to reference signal generator 109, and second signal synchronizer 119. First signal synchronizer 119 may cause the first reference signal generator to perform phase matching between the first reference frequency signal in the first semiconductor integrated circuit and the first reference frequency signal in the second semiconductor integrated circuit. Second signal synchronizer 119 may cause the second reference signal generator to perform phase matching between the first reference frequency signal in the first semiconductor integrated circuit and the first reference frequency signal in the second semiconductor integrated circuit.

With this configuration, if battery management system 200 as a whole includes only one second semiconductor integrated circuit, it is possible to measure all the currents of battery packs 101 in one location. In other words, a lack of the need for separately measuring the currents of battery packs 101 further simplifies a circuit configuration. Additionally, first signal synchronizer 119 and second signal synchronizer 119 each perform phase matching between the first reference frequency signal in the first semiconductor integrated circuit and the first reference frequency signal in the second semiconductor integrated circuit, which enables highly accurate measurement.

Other Embodiments

Although the embodiments have been described above, the present disclosure is not limited to the aforementioned embodiments.

For example, although the battery management system that manages the batteries used in a vehicle such as an EV has been described in each of the aforementioned embodiments, the battery management system may manage batteries used for any purpose.

Moreover, the circuit configurations described in the aforementioned embodiments are examples, and the present disclosure is not limited to the aforementioned circuit configurations. To put it another way, as with the aforementioned circuit configurations, the present disclosure includes a circuit that can perform the characteristic functions of the present disclosure. For example, the present disclosure includes a configuration obtained by connecting, to an element, a switching element (a transistor), a resistance element, or a capacitative element, etc. in series or parallel to the extent that the configuration can perform the same functions as the aforementioned circuit configurations.

Furthermore, the constituent elements included in the integrated circuits are realized by hardware in the aforementioned embodiments. However, part of the constituent elements included in the integrated circuits may be implemented by executing a software program suitable for the part of the constituent elements. The part of the constituent elements may be implemented by a program executor, such as a central processing unit or a processor, reading out and executing a software program recorded on a recording medium, such as a hard disk or a semiconductor memory.

In addition, a process performed by a specific processor may be performed by another processor in the aforementioned embodiments. Additionally, in the operations described in the aforementioned embodiments, the sequence in which processes are performed may be changed, and processes may be performed in parallel.

Forms obtained by making various modifications conceived by a person skilled in the art to each of the embodiments or forms realized by combining the constituent elements and functions in the embodiment as long as the forms do not depart from the essence of the present disclosure are included in the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable to a battery management circuit, a battery management system, and a battery management network that manage a secondary battery.

The invention claimed is:

1. A battery management circuit that manages a secondary battery, the battery management circuit comprising:
   a reference signal generator that generates a first reference frequency signal and a second reference frequency signal having a phase different from a phase of the first reference frequency signal;
   an alternating-current superimposer that superimposes an alternating current on the secondary battery, the alternating current having a frequency component of the first reference frequency signal;
   a voltage measurer that measures a voltage of the secondary battery by performing sampling using a frequency higher than a frequency of the first reference frequency signal;
   a current measurer that measures a current of the secondary battery by performing sampling using a frequency higher than the frequency of the first reference frequency signal; and
   a converter that converts each of results of measurements by the voltage measurer and the current measurer into a real part component and an imaginary part component of each of a complex voltage and a complex current, by multiplying the result of the measurement by the first reference frequency signal and the second reference frequency signal,
   wherein the voltage measurer and the current measurer repeatedly measure a voltage and a current of the secondary battery, respectively, and
   the battery management circuit comprises an integrator that averages real part components and imaginary part components of complex voltages and complex currents, respectively, the complex voltages and the complex currents corresponding to the repeated measurements.

2. The battery management circuit according to claim 1, wherein the voltage measurer includes at least one analog-to-digital converter for measuring a voltage of the secondary battery,
   the current measurer includes an analog-to-digital converter for measuring a current of the secondary battery, and
   the battery management circuit comprises a reference voltage circuit that supplies a common reference voltage to the at least one analog-to-digital converter of the voltage measurer and the analog-to-digital converter of the current measurer.

3. The battery management circuit according to claim 2, wherein the secondary battery includes a plurality of battery cells connected in series, and
   the voltage measurer includes, as the at least one analog-to-digital converter, as many analog-to-digital converters as the plurality of battery cells and measures a voltage of each of the plurality of battery cells.

4. The battery management circuit according to claim 1, wherein the battery management circuit is a single semiconductor integrated circuit.

5. The battery management circuit according to claim 1, comprising:
   a first semiconductor integrated circuit and a second semiconductor integrated circuit,
   wherein the first semiconductor integrated circuit includes the voltage measurer, a first reference signal generator that is the reference signal generator, and a first signal synchronizer,
   the second semiconductor integrated circuit includes the current measurer, a second reference signal generator equivalent to the reference signal generator, and a second signal synchronizer,
   the first signal synchronizer causes the first reference signal generator to perform phase matching between the first reference frequency signal in the first semiconductor integrated circuit and the first reference frequency signal in the second semiconductor integrated circuit, and
   the second signal synchronizer causes the second reference signal generator to perform phase matching between the first reference frequency signal in the first semiconductor integrated circuit and the first reference frequency signal in the second semiconductor integrated circuit.

6. The battery management circuit according to claim 1, wherein the second reference frequency signal has the phase orthogonal to the phase of the first reference frequency signal.

7. A battery management system comprising:
   the battery management circuit according to claim 1; and
   an integration controller that specifies the frequency of the first reference frequency signal to the battery management circuit,
   wherein the battery management circuit transmits the real part component and the imaginary part component of each of the complex voltage and the complex current to the integration controller, and
   the integration controller calculates a complex impedance of the frequency specified, from the real part component and the imaginary part component of each of the complex voltage and the complex current transmitted.

8. The battery management system according to claim 7, comprising:
   at least one battery management circuit that is the battery management circuit; and a communication cable that daisy chains the integration controller and the at least one battery management circuit,
wherein the integration controller collects the real part component and the imaginary part component from the at least one battery management circuit via the communication cable.

9. The battery management system according to claim 7, wherein the integration controller specifies the frequency of the first reference frequency signal multiple times while changing the frequency of the first reference frequency signal, and calculates a change in the complex impedance corresponding to a change in the frequency specified.

10. The battery management system according to claim 9, wherein the integration controller generates drawing data indicating a Cole-Cole plot in which a locus of a complex impedance is traced on a complex plane.

11. The battery management system according to claim 9, wherein the integration controller generates drawing data indicating a Bode plot in which a complex impedance is converted into a magnitude and a phase.

12. The battery management system according to claim 7, wherein the integration controller obtains a temperature of the secondary battery and converts the complex impedance into a complex impedance corresponding to a predetermined temperature, based on the temperature obtained.

13. The battery management system according to claim 12, wherein the integration controller calculates an element constant of circuit elements constituting an equivalent circuit model representing the secondary battery, based on the complex impedance corresponding to the predetermined temperature.

14. The battery management system according to claim 7, wherein the integration controller adds identification information for identifying the secondary battery to measurement information including the complex impedance calculated, and
transmits the measurement information to which the identification information has been added to a server device via a network.

15. The battery management system according to claim 14, wherein the integration controller receives battery information from the server device, the battery information including a result of estimating a state of the secondary battery based on the measurement information.

16. The battery management system according to claim 15, wherein the server device is included in a server device group sharing the battery information on the network.

17. The battery management system according to claim 16, wherein the integration controller causes the server device group to share an aggregate of block data including the measurement information or the battery information, by transmitting the block data to the server device.

18. A battery management network comprising:
the battery management system according to claim 17; and
the server device,
wherein the server device generates the battery information, based on the measurement information.

19. A battery management circuit that manages a secondary battery, the battery management circuit comprising:
a reference signal generator that generates a first reference frequency signal and a second reference frequency signal, the second reference frequency signal having a phase different from a phase of the first reference frequency signal;
an alternating-current superimposer that superimposes an alternating current on the secondary battery, the alternating current having a frequency component of the first reference frequency signal;
a voltage measurer that measures a voltage of the secondary battery by performing sampling using a frequency higher than a frequency of the first reference frequency signal;
a current measurer that measures a current of the secondary battery by performing sampling using a frequency higher than the frequency of the first reference frequency signal; and
a converter that converts each of results of measurements by the voltage measurer and the current measurer into a real part component and an imaginary part component of each of a complex voltage and a complex current, by multiplying the result of the measurement by the first reference frequency signal and the second reference frequency signal,
wherein the voltage measurer and the current measurer measure a voltage and a current of the secondary battery repeatedly,
the secondary battery includes a plurality of battery cells connected in series,
the battery management circuit comprises a multiplexer that selects one battery cell from the plurality of battery cells,
the voltage measurer includes at least one analog-to-digital converter for measuring a voltage of the secondary battery, and
the at least one analog-to-digital converter of the voltage measurer is one analog-to-digital converter and measures a voltage of the one battery cell selected by the multiplexer.

20. A battery management system comprising:
a battery management circuit that manages a secondary battery and includes: a reference signal generator that generates a first reference frequency signal and a second reference frequency signal, the second reference frequency signal having a phase different from a phase of the first reference frequency signal; an alternating current superimposer that superimposes an alternating current on the secondary battery, the alternating current having a frequency component of the first reference frequency signal; a voltage measurer that measures a voltage of the secondary battery by performing sampling using a frequency higher than a frequency of the first reference frequency signal; a current measurer that measures a current of the secondary battery by performing sampling using a frequency higher than the frequency of the first reference frequency signal; and a converter that converts each of results of measurements by the voltage measurer and the current measurer into a real part component and an imaginary part component of each of a complex voltage and a complex current, by multiplying the result of the measurement by the first reference frequency signal and the second reference frequency signal; and
an integration controller that specifies the frequency of the first reference frequency signal to the battery management circuit, wherein the voltage measurer and the current measurer measure a voltage and a current of the secondary battery repeatedly, the battery management circuit transmits the real part component and the imaginary part component of each of the complex voltage and the complex current to the integration controller, and the integration controller calculates a complex impedance of the frequency specified, from the real part component and the imaginary part component of each of the complex voltage and the complex current transmitted, and estimates a temperature of the secondary battery at a time of measurement, from the complex impedance calculated, a previously converted complex impedance, and information indicating a temperature of the secondary battery.

* * * * *